US007154269B1

(12) United States Patent
Haacke et al.

(10) Patent No.: US 7,154,269 B1

(45) Date of Patent: Dec. 26, 2006

(54) ITERATIVE METHOD FOR CORRECTION OF GEOMETRIC DISTORTION RESULTING FROM PHASE EVOLUTION DURING SEGMENTED ECHO PLANAR NUCLEAR MAGNETIC RESONANCE IMAGING AND APPARATUS THEREFOR

(75) Inventors: E. Mark Haacke, Grosse Pointe Farms, MI (US); Yingbiao Xu, Dunlap, IL (US)

(73) Assignee: MR Innovations, Inc., Detroit, MI (US)

( * ) Notice: Subject to any disclaimer, the term of this patent is extended or adjusted under 35 U.S.C. 154(b) by 0 days.

(21) Appl. No.: 11/270,755

(22) Filed: Nov. 9, 2005

(51) Int. Cl.
*G01V 3/00* (2006.01)

(52) U.S. Cl. ...................................... 324/309; 324/307

(58) Field of Classification Search ................ 324/309, 324/307, 300, 312, 318, 319, 322; 600/410
See application file for complete search history.

(56) References Cited

U.S. PATENT DOCUMENTS

| | | | |
|---|---|---|---|
| 5,742,163 A * | 4/1998 | Liu et al. | 324/309 |
| 6,975,113 B1 * | 12/2005 | Gurr | 324/309 |
| 7,042,215 B1 * | 5/2006 | Moriguchi et al. | 324/307 |
| 7,081,751 B1 * | 7/2006 | Twieg | 324/310 |
| 7,088,099 B1 * | 8/2006 | Doddrell et al. | 324/309 |

OTHER PUBLICATIONS

Beck, Gabrielle; et al; Reducing Oblique Flow Effects in Interleaved EPI With a Centric Reordering Technique; Magnetic Resonance in Medicine (2001) pp. 623-629, vol. 45; Wiley-Liss, Inc.

Buonocore, Michael H. and Gao, Lisheng; Ghost Artifact Reduction for Echo Planar Imaging Using Image Phase Correction; Magnetic Resonance in Medicine (1997) pp. 89-100; Williams & Wilkins.

Chen, Nan-Kuei and Wyrwicz, Alice M.; Correction for EPI Distortions Using Multi-Echo Gradient-Echo Imaging; Magnetic Resonance in Medicine (1999) pp. 1206-1213, vol. 41; Wiley-Liss, Inc.

Chen, Nan-Kuei and Wyrwicz, Alice M; Optimized Distortion Correction Technique for Echo Planar Imaging; Magnetic Resonance in Medicine (2001) pp. 525-528, vol. 45; Wiley-Liss, Inc.

Feinberg, David A., and Oshio, Koichi; Phase Errors in Multi-Shot Echo Planar Imaging; Magnetic Resonance in Medicine (1994) pp. 535-539; vol. 32; Williams & Wilkins.

Hu, Xiaoping and Le, Tuong Huu; Artifact Reduction in EPI with Phase-Encoded Reference Scan; Magnetic Resonance in Medicine (1996) pp. 166-171; vol. 36, Williams & Wilkins.

Jezzard, Peter and Balaban, Robert S.; Correction for Geometric Distortion in Echo Planar Images from $B_o$ Field Variations; Magnetic Resonance in Medicine (1995) pp. 65-73, vol. 34, Williams & Wilkins.

(Continued)

*Primary Examiner*—Brij B. Shrivastav
(74) *Attorney, Agent, or Firm*—Thompson Coburn LLP

(57) ABSTRACT

Segmented echo planar nuclear magnetic resonance imaging is performed using an iterative correction method that corrects or suppresses geometric distortion in the image domain caused by off-resonance phase discontinuities in the phase encoding direction. The iterative correction method can be performed in a single scan by providing extra gradients in the pulse sequence to generate an extra transverse magnetization echo from the pulse. Additionally, the iterative correction method can be performed using a separate non-segmented double-echo scan in combination with data obtained using a conventional segmented echo planar imaging pulse sequence.

20 Claims, 3 Drawing Sheets

RF/ADC 0 1 2 3 4

Gs

Gro

Gpe

OTHER PUBLICATIONS

Luk, Gerard T., et al; Reducing Flow Artifacts in Echo-Planar Imaging; Magnetic Resonance in Medicine (1997) pp. 436-447, vol. 37, Williams & Wilkins.

Reber, Paul J., et al; Correction of Off Resonance-Related Distortion in Echo-Planar Imaging Using EPI-Based Field Maps; Magnetic Resonance in Medicine (1998) pp. 328-330; vol. 39, Williams & Wilkins.

Reeder, Scott B. et al; Multi-Echo Segmented k-space Imaging: An Optimized Hybrid Sequence for Ultrafast Cardiac Imaging; Magnetic Resonance in Medicine (1999) pp. 375-385, vol. 41, Wiley-Liss, Inc.

Wan, Xin, et al; Reduction of Geometric and Intensity Distortions in Echo-Planar Imaging Using a Multireference Scan; Magnetic Resonance in Medicine (1997) pp. 932-944, vol. 37, Williams & Wilkins.

* cited by examiner

ITERATIVE METHOD FOR CORRECTION OF GEOMETRIC DISTORTION RESULTING FROM PHASE EVOLUTION DURING SEGMENTED ECHO PLANAR NUCLEAR MAGNETIC RESONANCE IMAGING AND APPARATUS THEREFOR

BACKGROUND OF THE INVENTION (1) Field of the Invention

The present invention pertains to the field of nuclear magnetic resonance imaging. More particularly, the present invention pertains to methods of performing segmented echo planar nuclear magnetic resonance imaging.

(2) General Background

Interleaved segmented echo planar imaging (SEPI) (also referred to as multi-shot) offers a fast approach for high resolution volumetric magnetic resonance imaging using a variety of imaging techniques. Interleaved SEPI provides higher image resolution and superior handling of off-resonance behavior as compared to single shot (non-segmented) echo planar imaging.

The echo time shifting (ETS) technique can be used in SEPI imaging methods to effectively smooth the discontinuities between regions of data and create a ghost free magnitude image. However, phase evolution in the phase encoding direction with linear $k_y$ dependence present in the ETS technique puts back large geometric distortion similar to that which occurs using single shot echo planar imaging techniques. The application of improved gradients and calibration techniques in combination with echo time shifting techniques effectively eliminates ghosting or blurring resulting from phase discontinuities between segments. However, such prior art techniques fail to eliminate distortion resulting from off-resonance phase shifts in the phase encoding direction, and these undesirable phase shifts remain problematic. This is especially the case when generating high resolution images using alternate echo sampling to achieve better flow properties during imaging related to magnetic resonance angiography. If phase evolution is not accounted for when using a SEPI technique, the merging of k-space lines will yield an image with distortion in the phase encoding direction.

Field mapping methods effectively reduce image distortion originating from static off-resonance effects resulting from such things as $B_o$ field inhomogeneity and chemical shift. The field map is typically derived from phase information obtained from either a double-echo gradient echo or offset spin-echo images. However, the phase residual resulting from the complex division of images having different echo times must be unwrapped to ascertain the field inhomogeneity map.

The use of multiple reference scans and multi-echo gradient-echo imaging reduces both $B_o$ field inhomogeneity and eddy current effects. Moreover, phase shifted echo planar imaging pulse sequences that take into account all off-resonance effects including gradient waveform imperfections have been developed. However, all such methods require appreciable extra time and heavy post processing as compared to methods that do not compensate for off-resonance effects. As such, inter-scan motion may even reduce the practical application of such methods.

SUMMARY OF THE INVENTION

The present invention provides means for correcting or suppressing geometric distortion caused by off-resonance effects during SEPI procedures using a single scan. The invention also provides means for suppressing geometric distortion caused by off-resonance effects during SEPI procedures using a second scan with an accurate, non-approximated phase map.

In a first aspect of the invention, a method of generating a magnetic resonance image matrix of an object comprises a step of transmitting a plurality of radio frequency electromagnetic pulses into an object and applying a sequence of magnetic field gradients following each of the pulses. This is performed in a manner such that each of the pulses results in a series of transverse magnetization echoes being generated by the object. The method further comprises a step of utilizing a plurality of the echoes that each have a first echo number in a manner generating initial k-space data for a first region of data points of an array of data points. Furthermore, the method comprises a step of utilizing a plurality of the echoes that each have a second echo number in a manner generating initial k-space data for a second region of the data points of the array. The second echo number is different from the first echo number. The method further comprises steps of generating a first k-space matrix for the array using the initial k-space data generated for the first region of the array and performing a domain transformation on the first k-space matrix in a manner generating a first image matrix for the array. Still further, the method comprises steps of altering phase data associated with at least a portion of the first image matrix in a manner creating a second image matrix for the array and performing a domain transformation on the second image matrix in a manner generating a second k-space matrix for the array. Additionally, the method comprises a step of generating a third k-space matrix for the array using data obtained from a portion of the second k-space matrix that corresponds to the first region of the array and using data obtained from the initial k-space data acquired for the second region of the array to fill a portion of the second k-space matrix that corresponds to the second region of the array. Furthermore, the method comprises a step of performing a domain transformation on the third k-space matrix in a manner generating a third image matrix for the array.

In a second aspect of the invention, an apparatus is adapted and configured to perform the method of the first aspect of the invention.

In a third aspect of the invention, a method of generating a magnetic resonance image matrix comprises a step of obtaining initial k-space data for an array of data points. The initial k-space data obtained for a first region of the array is obtained via transverse magnetization echoes having a first echo number. The initial k-space data obtained for a second region of the array is obtained via transverse magnetization echoes having a second echo number. The initial k-space data of a third region of the array is obtained from transverse magnetization echoes having a third echo number. The initial k-space data of a fourth region of the array is obtained from transverse magnetization echoes having a fourth echo number. The first, second, third, and fourth echo numbers are different from each other.

This method also comprises a step of generating a first k-space matrix for the array. A portion of the first k-space matrix that corresponds to the first region of the array is filled with the initial k-space data obtained for the first region of the array and the remainder of the first k-space matrix is filled with zeroes.

Furthermore, this method comprises steps of performing a domain transformation on the first k-space matrix in a manner generating a first image matrix for the array and altering phase data associated with at least a portion of the first image matrix in a manner creating a second image matrix for the array. The second image matrix has phase data that approximates phase data that the first image matrix would have had if the initial k-space data for the first region of the array had been obtained from echoes having the second echo number rather than the first echo number.

Still further, this method comprises a step of performing a domain transformation on the second image matrix in a manner generating a second k-space matrix for the array. The data in a portion of the second k-space matrix that corresponds to the first region of the array constitutes phase shifted data.

Additionally, this method comprises generating a third k-space matrix for the array. A portion of the third k-space matrix that corresponds to the first region of the array is filled with the phase shifted data of the second k-space matrix. A portion of the third k-space matrix that corresponds to the second region of the array is filled with the initial k-space data obtained for the second region. The remainder of the third k-space matrix is filled with zeroes.

Yet another step of this method is a step of performing a domain transformation on the third k-space matrix in a manner generating a third image matrix for the array and altering phase data associated with at least a portion of the third image matrix in a manner creating a fourth image matrix for the array. The fourth image matrix has phase data that approximates phase data that the third image matrix would have had if the initial k-space data for the first and second regions of the array had been obtained from echoes having the third echo number.

Furthermore, this method comprises a step of performing a domain transformation on the fourth image matrix in a manner generating a fourth k-space matrix for the array. Data in a portion of the fourth k-space matrix that corresponds to the first and second regions of the array constitutes phase shifted data.

Another step of this method is a step of generating a fifth k-space matrix. A portion of the fifth k-space matrix that corresponds to the first and second regions of the array is filled with the phase shifted data of the fourth k-space matrix. A portion of the fifth k-space matrix that corresponds to the third region of the array is filled with the initial k-space data obtained for the third region. The remainder of the fifth k-space matrix is filled with zeroes.

This method further comprises steps of performing a domain transformation on the fifth k-space matrix in a manner generating a fifth image matrix for the array and altering phase data associated with at least a portion of the fifth image matrix in a manner creating a sixth image matrix for the array. The sixth image matrix has phase data that approximates phase data that the fifth image matrix would have had if the initial k-space data for the first, second, and third regions of the array had been obtained from echoes having the fourth echo number.

Additionally, this method comprises a step of performing a domain transformation on the sixth image matrix in a manner generating a sixth k-space matrix for the array. Data in a portion of the sixth k-space matrix that corresponds to the first, second, and third regions of the array constitutes phase shifted data.

This method further comprises a step of generating a seventh k-space matrix. A portion of the seventh k-space matrix that corresponds to the first, second, and third regions of the array are filled with the phase shifted data of the sixth k-space matrix. A portion of the seventh k-space matrix that corresponds to the fourth region of the array is filled with the initial k-space data obtained for the fourth region. Any remainder of the seventh k-space matrix is filled with zeroes.

Still further, this method comprises performing a domain transformation on the seventh k-space matrix in a manner generating a seventh image matrix for the array.

In a fourth aspect of the invention, an apparatus is adapted and configured to perform the method of the third aspect of the invention.

While the principal advantages and features of the invention have been described above, a more complete and thorough understanding of the invention may be obtained by referring to the drawings and the detailed description of the preferred embodiments, which follow.

Figure 1:
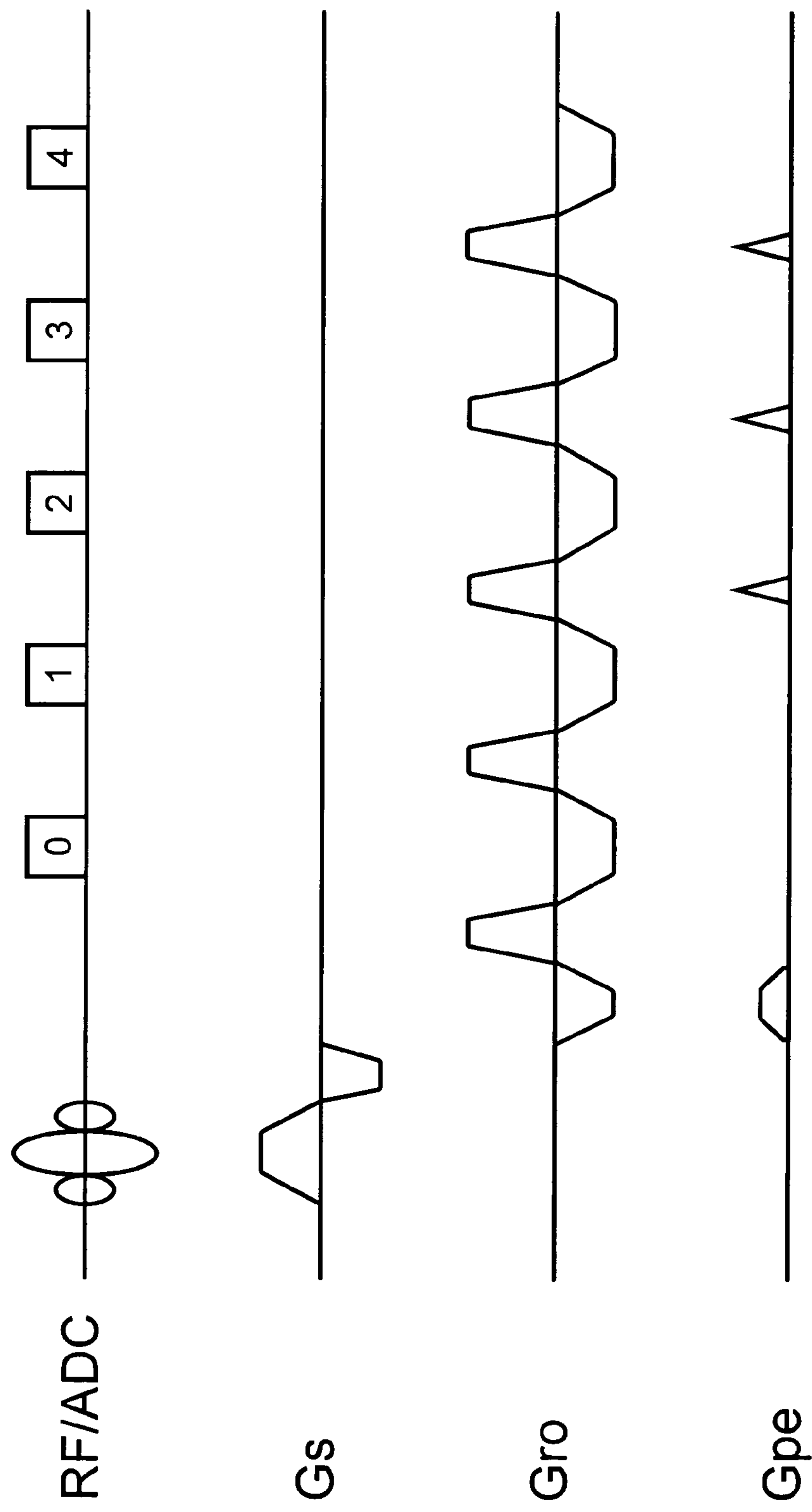
FIG. 1 is schematic of a pulse sequence utilized in connection with a first preferred method of practicing the invention.

Reference characters in the written specification correspond to the reference characters shown in the drawing figures.

DETAILED DESCRIPTION OF THE PREFERRED METHODS OF PRACTICING THE INVENTION

The preferred method of practicing the invention can be practiced using a single SEPI scan and makes use of an extra echo in its pulse sequence design. FIG. 1 depicts an example of a pulse sequence for use in connection with the preferred method of practicing the invention. The pulse sequence preferably uses centric phase encoding for the first transverse magnetization echo to be acquired and preferably maintains that same phase encoding for the next echo to be acquired. The remaining echoes to be acquired are phase encoded in a conventional manner. As will be explained, generating two similarly phase encoded echoes from each given pulse allows for an estimate of the source of field inhomogeneity that can be used to correct for the phase shift between echoes.

The pulse sequence shown in FIG. 1 is configured for use in connection with high resolution k-space domains, such as a k-space domain comprising two hundred and fifty-six or more k-space lines. At this resolution, it has been determined that an echo planar imaging factor (EPI factor) of four, is sufficient for the extra echoes to cover a percentage of the k-space that will provide an adequate estimate of the phase map. With an EPI factor of four, a k-space domain comprising two hundred and fifty-six k-space lines can be obtained from sixty-four radio frequency electromagnetic pulses. It should be appreciated that at higher resolutions, a greater EPI factor may also yield adequate results.

Using the pulse sequence described above, it is possible to perform an iterative image/k-space matrix reconstruction method to account for the phase evolution between echoes for all spatial locations in the image matrix. However, prior to explaining the sampling and reconstruction sequence of the preferred method of practicing the invention, it is helpful to provide a definition for the phrase "echo number" as it is used herein. Each radio frequency electromagnetic pulse emitted into an object during SEPI is followed by a series of appropriate magnetic field gradients applied in at least two directions and results in the object generating a series of transverse magnetization echoes. Each consecutive echo resulting from any given pulse has an echo number that is one greater than the echo number of the echo preceding it, beginning with the first echo having an echo number of one. Thus it should be appreciated that the "echo number" of any given transverse magnetization echo is equal to one plus the number of echoes generated by the object as a result of the same pulse prior to the given echo.

During the sampling of the transverse magnetization echoes resulting from the pulse sequence, preferably only echoes with even echo numbers are sampled. This minimizes flow dephasing effects between sampled echoes, and thereby improves the accuracy of the estimated static off-resonance effect.

Figure 2:
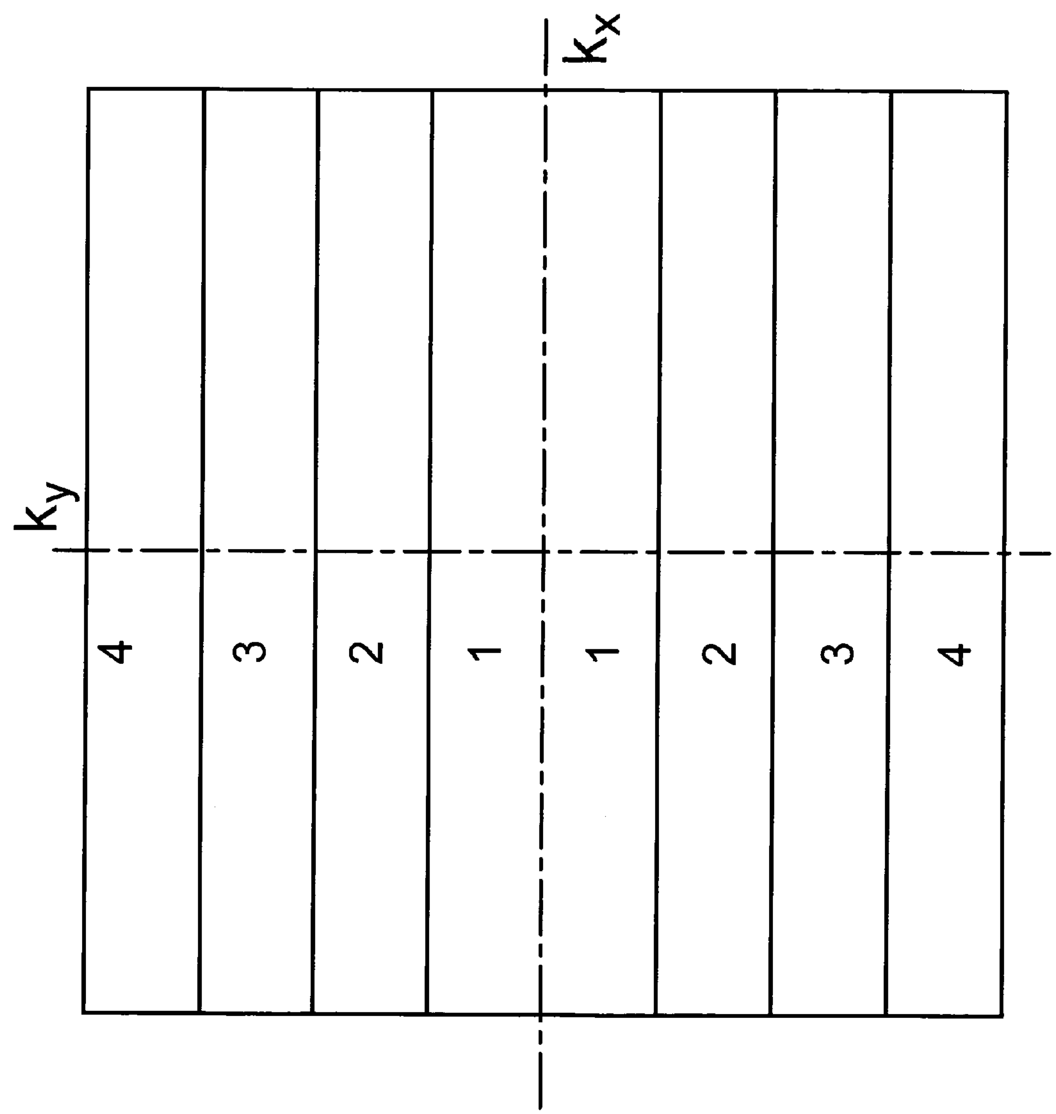
FIG. 2 is a schematic of k-space divided into regions in accordance with the first preferred method of practicing the invention.

FIG. 2 is a depiction of the k-space domain, which is an array of data points, and the regions for the interleaved EPI sequence of the preferred method of practicing the invention. The preferred method of practicing the invention utilizes, for example, an EPI factor of four and the k-space domain is therefor divided into four regions. Each region represents a group of k-space data points sampled from echoes having the same echo number. Each region comprises two separate segments spaced symmetrically about the $k_x$ axis. The two segments forming region 1 are immediately adjacent each other such that region 1 defines a contiguous group of data points. The k-space data is preferably sampled with a center out trajectory. In other words, the echo number of the echoes sampled to fill region 1 of k-space is less than the echo number of the of the echoes sampled to fill region 2, which in turn is less than the echo number of the echoes sampled to fill region 3, and so on and so forth. For reference herein, this sampled or acquired data is hereinafter referred to as initial k-space data. The initial k-space data is preferably acquired in a conventional manner. In addition to this initial k-space data, the preferred method of practicing the invention comprises sampling extra or secondary k-space data for region 1. This is done in a manner such that two sets of k-space data are obtained for region 1, with each set being sampled from echoes having an echo number that differs from the echo number of the echoes sampled for the other set. Preferably, the echo number of the echoes used to acquire the secondary k-space data for region 1 is less than, or at least differs from, each of the echo numbers of all other echoes used to acquire the initial k-space data. As such, the initial data and the secondary k-space data can be acquired concurrently from echoes resulting from the same radio frequency pulses, without the need for any additional pulses. Thus, it should be appreciated that acquisition time of the data required to perform the preferred method of practicing the invention does not differ appreciably from the acquisition time of data required to perform a conventional prior art SEPI method having the same EPI factor.

With the k-space data acquired as described above, a phase corrected image matrix can be generated using an iterative reconstruction approach. For purposes of describing this process, any region of any k-space or image matrix that is referred to by number is a region of the matrix that corresponds to the region of the k-space domain that is referred to by the same number. Preferably, the iterative reconstruction approach begins by generating a first k-space matrix for the k-space domain or array by filling region 1 of the first matrix with the initial k-space data acquired for region 1 and by zero filling all other regions of the array, and by generating a second k-space matrix by filling region 1 of the array with the secondary k-space data and zero filling all other regions of the array. Either one of these two steps could be performed before the other and they could be performed simultaneously. A domain transformation is performed on each of these first and second k-space matrixes in a manner generating first and second complex image matrixes, $\rho_1(x,y)$ and $\rho_2(x,y)$, respectively. It should be appreciated that there is a phase shift between these two images that results from the fact that the k-space data associated with the first image matrix was collected from echoes having a particular echo number and the k-space data associated with the second image matrix was collected from echoes having some other echo number. It should also be appreciated that the phase evolution, $\phi(x,y)$, between any two echoes resulting from the same pulse is a function of the local static field inhomogeneity $\Delta B(x,y)$, the chemical shift $\Delta f_{cs}$, and the echo spacing $T_{es}$. More specifically, $\phi(x,y)=-\gamma(\Delta B(x, y)+2\pi\Delta f_{cs}/\gamma)T_{es}$, where $\gamma$ is the gyromagnetic ratio. This phase evolution continues from echo to echo. Using these principles, the phase evolution factor is calculated from the first and second image matrixes. It should be appreciated that, in the preferred method of practicing the invention, the estimate for the phase evolution is obtained solely from region 1 of the k-space domain, which is centrally located in the k-space domain. This estimate of the phase map provides sufficiently accurate results when region 1 covers a sufficiently large portion of the central part of k-space.

Having determined the phase evolution factor, the phase of the first image matrix is then altered in a manner creating a third image matrix, $\rho_3(x,y)$, whose phase is shifted or altered from the phase of the first image matrix as if the echo number of the echoes used to acquire the k-space data for the first region of k-space was instead equal to the echo number of the echoes used to acquire k-space data for the second region of k-space. Assuming that the difference between the echo numbers of the echoes used to acquire the initial k-space data and the secondary k-space data for the first region of k-space is equal to the difference between and the echo number of the echoes used to acquire the initial k-space data for the first region of k-space and the echo number of the echoes used to acquire the initial k-space data for the second region of k-space, $\rho_3(x,y)$ is simply $\rho_1(x,y)$ multiplied by $\exp(i\phi(x, y))$.

A domain transformation is then performed on the third image matrix in a manner that generates a third k-space matrix. A fourth k-space matrix is then generated using the data of the third k-space matrix and the initial k-space data acquired for the second region of k-space. More specifically, the data in the first region of the fourth k-space matrix is set equal to the data in first region of the third k-space matrix, and the data of the second region of the fourth k-space matrix is filled using the initial k-space data acquired for the second region of k-space. The other regions of the fourth k-space matrix are preferably zero filled.

A domain transformation is then performed on the fourth k-space matrix in a manner that generates a fourth image matrix, $\rho_4(X,y)$. It should be appreciated that the effect of phase evolution between the first and second regions of the fourth image matrix has at this point been accounted for and effectively removed. The fourth image matrix is then altered in a manner creating a fifth image matrix whose phase is shifted from the phase of the fourth image matrix as if the data therein had been collected from echoes having the same echo number as the echoes used to acquire the initial k-space data for the third region of k-space by multiplying $\rho_4(x,y)$ by $\exp(i\phi(x, y))$. Again, it should be appreciated that this simple calculation assumes that the difference between the echo numbers of the echoes used to acquire the initial k-space data and the secondary k-space data for the first region of k-space is equal to the difference between the echo number of the echoes used to acquire the initial k-space data for the second region of k-space and the echo number of the echoes used to acquire the initial k-space data for the third region of k-space. If this is not the case, it should be obvious to one of skill in the art that $i\phi(x, y)$ can be multiplied by an appropriate factor in the equation or otherwise utilized to achieve the desired result.

A domain transformation is then performed on the fifth image matrix in a manner that generates a fifth k-space matrix. From this, a sixth k-space matrix is then generated using the data of the fifth k-space matrix and the initial k-space data acquired for the third region of k-space. More specifically, the data in first and second regions of the sixth k-space matrix is set equal to the data in first and second regions of the fifth k-space matrix, and the third region of the sixth k-space matrix is filled using the initial k-space data acquired for the third region of k-space. The fourth region of the sixth k-space matrix is preferably zero filled.

A domain transformation is then performed on the sixth k-space matrix in a manner that generates a sixth image matrix, $\rho_6(x,y)$. The effect of phase evolution between the first, second, and third regions of the sixth image matrix has at this point been accounted for and effectively removed. The sixth image matrix is then altered in a manner creating a seventh image matrix whose phase is shifted from the phase of the sixth image matrix as if the data therein had been collected from echoes having the same echo number as the echoes used to acquire the initial k-space data for the fourth region of k-space by multiplying $\rho_6(x,y)$ by $\exp(i\phi(x, y))$, including an appropriate factor if needed as discussed above.

A domain transformation is then performed on the seventh image matrix in a manner that generates a seventh k-space matrix. From this, an eighth k-space matrix is then generated using data in the seventh k-space matrix and the initial k-space data acquired for the fourth region of k-space. More specifically, the data in first, second, and third regions of the eighth k-space matrix is set equal to the data in first, second, and third regions of the seventh k-space matrix, and the fourth region of the eighth k-space matrix is filled using the initial k-space data acquired for the fourth region of k-space.

The method of the preferred method of practicing the invention preferably concludes by performing a domain transformation on the eighth k-space matrix in a manner that generates an eighth image matrix. The effect of phase evolution between all regions of the eighth image matrix has at this point been accounted for and effectively removed, and the entire image is thereby a geometric distortion corrected (GDC) image.

It should be appreciated that similar steps could be performed in accordance with the invention for imaging methods having EPI factors other than four simply by performing more or less iterations between the k-space and image domains. It should also be appreciated that the use of a center out k-space trajectory makes it possible to do a phase correction iteratively using fast Fourier transforms to make the method efficient. Still further, it should be appreciated that the phase of each region could be altered to correlate with the phase associated with the initial k-space data collected for the first region of the k-space, rather than the last region.

Figure 3B:
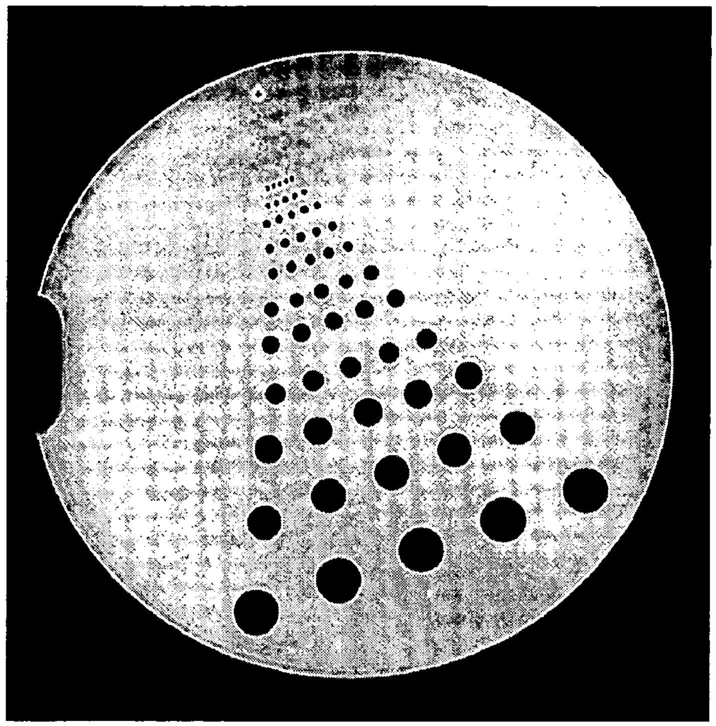
FIG. 3B is a magnetic resonance image of the test object shown in FIG. 3A generated using the first preferred method of practicing the invention.
Figure 3A:
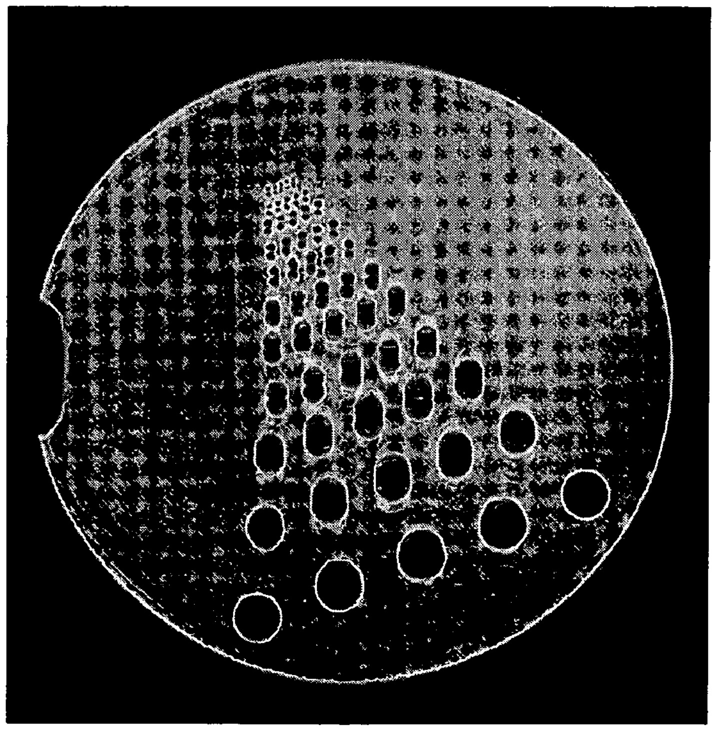
FIG. 3A is a magnetic resonance image of a test object generated using a prior art SEPI imaging technique.

Comparison results obtained using a prior art SEPI magnetic resonance imaging technique as compared to results obtained using the preferred method of the invention are shown in FIGS. 3A and 3B, respectively. The k-space data used to generate these images was acquired using the sequence shown on FIG. 1 in connection with a Siemens Sonata 1.5 T™ nuclear magnetic resonance scanner. Raw data obtained from the scan was downloaded to a computer for off-line image reconstruction. The images have a resolution of 1 millimeter by 1 millimeter by 2 millimeters, and the phase encoding direction was from right to left.

The image shown in FIG. 3A is a phantom magnitude image of a test object that was reconstructed from the raw data using a standard SEPI technique, without any phase correction alterations. As is apparent from FIG. 3A, the largest resolution circle is reasonably well delineated with the central k-space alone. However, the phase discontinuities between echoes cause severe distortion in two opposite directions (because of the centric k-space coverage) and blurring for the small resolution circles.

The image shown in FIG. 3B is a magnitude image that was reconstructed from the same data using the preferred embodiment of practicing the invention. Geometric distortion and blurring are mostly eliminated, which indicates a successful reduction of the effects of phase evolution between echoes. However, the correction is not perfect in the area of the smallest circles. There are residual ripples that are the result of missing high frequency information in the estimated phase map.

The results obtained represent a dramatic improvement in image quality. The preferred method of practicing the invention is fast, requires no phase unwrapping or reference scan, and can be easily implemented online. However, there is a trade-off between higher EPI factors and the accuracy of the phase map when relying on an extra echo in the pulse sequence to obtain the phase shift information.

It should be appreciated that the results obtained using the method of the preferred embodiment improve as the matrix size increases and the EPI factor remains the same. Additionally, the results obtained using the method of the preferred embodiment improve as the EPI factor decreases and the matrix size remains the same. Still further, it should be appreciated, that for any high resolution, 3D imaging method, a small voxel size requires a fairly low bandwidth to ensure an adequate signal-to-noise ratio. This implies that the practical limit of EPI factor is driven by other concerns such as ensuring that the duration of the echo train is not so long that a T2* filtering effect becomes a problem.

A second method in accordance with the invention comprises an iterative technique that is similar to the iterative technique of the method of the first embodiment described above. However, rather than utilizing an extra echo in the SEPI pulse sequence to obtain the phase evolution factor, this second method utilizes a separate non-SEPI double echo scan of all of k-space to determine a very precise phase evolution factor. From the separate scan, two k-space matrixes are generated, each of which is devoid of phase discontinuities resulting from phase evolution. These k-space matrixes are then transformed into the image domain and the phase difference between the images matrixes is then used to determine the phase evolution factor. This factor is then used in connection with the SEPI scans to perform the iterative steps of altering the phase of the k-space regions to compensate for the phase evolution between the regions in a manner similar to the previously discussed method of practicing the invention. It should be appreciated that utilizing this second method of practicing the invention eliminates even the minor geometric distortion ripples that remained after performing the first preferred method of the invention because the phase map is not an approximation obtained from only central k-space, but instead is derived from data obtained from data obtained from the entire k-space domain. Additionally, because this method does not rely on the proportion of k-space covered by the first region, the accuracy is independent of the EPI factor of the SEPI scans. However, performing the method of the second embodiment may require additional time as compared to the first method of practicing the invention and may be affected more significantly by patient movement. It should also be appreciated that the imaging parameters used to generate the phase map are not critical to the application of the method of the invention because an accurate representation of the phase only depends on the signal-to-noise and the echo time.

While the present invention has been described in reference to a specific methods of practicing the invention, in light of the foregoing, it should be understood that all matter contained in the above description or shown in the accompanying drawings is intended to be interpreted as illustrative and not in a limiting sense and that various modifications and variations of the invention may be constructed without departing from the scope of the invention defined by the following claims. For example, it should be appreciated that, in accordance with the invention, the methods disclosed herein could be combined with other imaging methods, such as parallel imaging or partial Fourier imaging, which could reduce the time require for data acquisition. It should also be appreciated that the use of the invention may be advantageous in connection with diffusion weighted imaging, perfusion weighted imaging, functional brain MRI imaging, and susceptibility weighted imaging. Thus, other possible variations and modifications should be appreciated.

Furthermore, it should be understood that when introducing elements of the present invention in the claims or in the above description of the preferred method of practicing the invention, the terms “comprising,” “including,” and “having” are intended to be open-ended and mean that there may be additional elements other than the listed elements. Additionally, the term “portion” should be construed as meaning some or all of the item or element that it qualifies.

What is claimed is:

1. A method of generating a magnetic resonance image matrix of an object, the method comprising:

transmitting a plurality of radio frequency electromagnetic pulses into an object and applying a sequence of magnetic field gradients following each of the pulses in a manner such that each of the pulses results in a series of transverse magnetization echoes being generated by the object;

utilizing a plurality of the echoes that each have a first echo number in a manner generating initial k-space data for a first region of data points of an array of data points;

utilizing a plurality of the echoes the each have a second echo number in a manner generating initial k-space data for a second region of the data points of the array, the second echo number being different from the first echo number;

generating a first k-space matrix for the array using the initial k-space data generated for the first region of the array;

performing a domain transformation on the first k-space matrix in a manner generating a first image matrix for the array;

altering phase data associated with at least a portion of the first image matrix in a manner creating a second image matrix for the array;

performing a domain transformation on the second image matrix in a manner generating a second k-space matrix for the array;

generating a third k-space matrix for the array using data obtained from a portion of the second k-space matrix that corresponds to the first region of the array and using data obtained from the initial k-space data acquired for the second region of the array to fill a portion of the second k-space matrix that corresponds to the second region of the array; and performing a domain transformation on the third k-space matrix in a manner generating a third image matrix for the array.

2. A method in accordance with claim 1 wherein the first k-space matrix is zero filled in all regions of the array other than the first region.

3. A method in accordance with claim 1 wherein the second and third k-space matrixes contain identical k-space data for the first region of the array.

4. A method in accordance with claim 1 wherein the first echo number is less than the second echo number.

5. A method in accordance with claim 1 wherein the method further comprises:

utilizing a plurality of the echoes that each have a third echo number to generate initial k-space data for a third region of the data points of the array, the third echo number being different from each of the first and second echo numbers;

altering phase data associated with at least a portion of the third image matrix in a manner creating a fourth image matrix for the array;

performing a domain transformation on the fourth image matrix in a manner generating a fourth k-space matrix for the array;

generating a fifth k-space matrix for the array using data obtained from the fourth k-space matrix for the first and second regions of the array and using data obtained from the initial k-space data acquired for the third region of the array to fill the third region of the array;

performing a transformation on the fifth k-space matrix in a manner generating a fifth image matrix for the array.

6. A method in accordance with claim 5 wherein the first k-space matrix is zero filled in all regions of the array other than the first region, and wherein the third k-space matrix is zero filled in all regions of the array other than the first and second regions.

7. A method in accordance with claim 1 wherein the method further comprises:

utilizing a plurality of the echoes that each have a third echo number to generate secondary k-space data for the first region of the data points of the array, the third echo number being different from the first echo number;

generating a fourth k-space matrix for the array using the secondary k-space data acquired for the first region of the array;

performing a domain transformation on the fourth k-space matrix in a manner generating a fourth image matrix for the array;

calculating a phase shift between the first echo number and the third echo number using the first and fourth image matrixes; and using the phase shift to perform the step of altering phase data associated with at least the portion of the first image matrix.

8. A method in accordance with claim 7 wherein the third echo number is different from the second echo number.

9. A method in accordance with claim 8 wherein the third echo number is equal to the first echo number minus two, and wherein the second echo number is equal to the first echo number plus two.

10. A method in accordance with claim 1 wherein the second region of the array comprises a pair of segments, and wherein the first region is positioned between the pair of segments of the second region in the array.

11. A method in accordance with claim 1 wherein the first region of the array is a contiguous region of the data points.

12. A method in accordance with claim 11 wherein the first region of the array is centrally positioned in the array.

13. An apparatus that is adapted and configured to perform a method in accordance with claim 1.

14. A method of generating a magnetic resonance image matrix, the method comprising:

obtaining initial k-space data for an array of data points, the initial k-space data obtained for a first region of the array being obtained via transverse magnetization echoes having a first echo number, the initial k-space data obtained for a second region of the array being obtained via transverse magnetization echoes having a second echo number, the initial k-space data of a third region of the array being obtained from transverse magnetization echoes having a third echo number, and the initial k-space data of a fourth region of the array being obtained from transverse magnetization echoes having a fourth echo number, the first, second, third, and fourth echo numbers being different from each other;

generating a first k-space matrix for the array, a portion of the first k-space matrix that corresponds to the first region of the array being filled with the initial k-space data obtained for the first region of the array and the remainder of the first k-space matrix being filled with zeroes;

performing a domain transformation on the first k-space matrix in a manner generating a first image matrix for the array;

altering phase data associated with at least a portion of the first image matrix in a manner creating a second image matrix for the array, the second image matrix having phase data that approximates phase data that the first image matrix would have had if the initial k-space data for the first region of the array had been obtained from echoes having the second echo number rather than the first echo number;

performing a domain transformation on the second image matrix in a manner generating a second k-space matrix for the array, data in the second k-space matrix that corresponds to the first region of the array constituting phase shifted data;

generating a third k-space matrix for the array, a portion of the third k-space matrix that corresponds to the first region of the array being filled with the phase shifted data of the second k-space matrix, a portion of the third k-space matrix that corresponds to the second region of the array being filled with the initial k-space data obtained for the second region, the remainder of the third k-space matrix being filled with zeroes;

performing a domain transformation on the third k-space matrix in a manner generating a third image matrix for the array;

altering phase data associated with at least a portion of the third image matrix in a manner creating a fourth image matrix for the array, the fourth image matrix having phase data that approximates phase data that the third image matrix would have had if the initial k-space data for the first and second regions of the array had been obtained from echoes having the third echo number;

performing a domain transformation on the fourth image matrix in a manner generating a fourth k-space matrix for the array, data in the fourth k-space matrix that corresponds to the first and second regions of the array constituting phase shifted data;

generating a fifth k-space matrix, a portion of the fifth k-space matrix that corresponds to the first and second regions of the array being filled with the phase shifted data of the fourth k-space matrix, a portion of the fifth k-space matrix that corresponds to the third region of the array being filled with the initial k-space data obtained for the third region, and the remainder of the fifth k-space matrix being filled with zeroes;

performing a domain transformation on the fifth k-space matrix in a manner generating a fifth image matrix for the array;

altering phase data associated with at least a portion of the fifth image matrix in a manner creating a sixth image matrix for the array, the sixth image matrix having phase data that approximates phase data that the fifth image matrix would have had if the initial k-space data for the first, second, and third regions of the array had been obtained from echoes having the fourth echo number;

performing a domain transformation on the sixth image matrix in a manner generating a sixth k-space matrix for the array, data in the sixth k-space matrix that corresponds to the first, second, and third regions of the array constituting phase shifted data;

generating a seventh k-space matrix, a portion of the seventh k-space matrix that corresponds to the first, second, and third regions of the array being filled with the phase shifted data of the sixth k-space matrix, a portion of the seventh k-space matrix that corresponds to the fourth region of the array being filled with the initial k-space data obtained for the fourth region, and any remainder of the seventh k-space matrix is filled with zeroes; and performing a domain transformation on the seventh k-space matrix in a manner generating a seventh image matrix for the array.

15. A method in accordance with claim 14 wherein the method further comprises steps of:

transmitting a plurality of radio frequency electromagnetic pulses, each of the pulses resulting in one of the echoes having the first echo number, one of the echoes having the second echo number, one of the echoes having the third echo number, one of the echoes having the fourth echo number, and another transverse magnetization echo having a fifth echo number, the fifth echo number being different from each of the first, second, third, and fourth echo numbers;

obtaining secondary k-space data for the first region of the array via the echoes that have the fifth echo number;

generating an eighth k-space matrix for the array, a portion of the eighth k-space matrix that corresponds to the first region of the array being filled with the secondary k-space data obtained for the first region and the remainder of the eighth k-space matrix being filled with zeroes;

performing a domain transformation on the eighth k-space matrix in a manner generating an eighth image matrix for the array; and using differences between the first and eighth image matrixes to create each of the second, fourth, and sixth image matrixes.

16. A method in accordance with claim 15 wherein the third echo number is two less than the fourth echo number, the second echo number is two less than the third echo number, the first echo number is two less than the second echo number, and the fifth echo number is two less than the first echo number.

17. A method in accordance with claim 14 wherein the method further comprises steps of:

transmitting a first plurality of radio frequency electromagnetic pulses, each of the pulses resulting in generation of one of the echoes having echo the first echo number, one of the echoes having the second echo number, one of the echoes having the third echo number, one of the echoes having the fourth echo number;

transmitting a second plurality of radio frequency electromagnetic pulses, each of the pulses resulting in generation of a transverse magnetization echo having a fifth echo number and a transverse magnetization echo having a sixth echo number, the second plurality of radio frequency electromagnetic pulse being distinct from the first electromagnetic pulses, the fifth echo number being different from the sixth echo number, the fifth and sixth echo numbers each being one of less than, equal to, and greater than the first, second, third, and fourth echo numbers;

obtaining secondary k-space data for the first, second, third, and fourth regions of the array via the echoes that have the fifth echo number;

obtaining tertiary k-space data for the first, second, third, and fourth regions of the array via the echoes that have the sixth echo number;

generating an eighth k-space matrix for the array, at least a portion of the eighth k-space matrix that corresponds to the first, second, third, and fourth regions of the array being filled with the secondary k-space data;

generating a ninth k-space matrix for the array, at least a portion of the ninth k-space matrix that corresponds to the first, second, third, and fourth regions of the array being filled with the tertiary k-space data;

performing a domain transformation on each of the eighth and ninth k-space matrixes in a manner generating eighth and ninth image matrixes for the array respectively; and using differences between the eighth and ninth image matrixes to create each of the second, fourth, and sixth image matrixes.

18. A method in accordance with claim 14 wherein the first, second, third, and fourth regions of the array constitute the only regions of the array.

19. A method in accordance with claim 14 wherein each of the second, third, and fourth regions of the array comprises a pair of segments, and wherein the pair of segments of the third region are positioned between the pair of segments of the fourth region in the array, the pair of segments of the second region are positioned between the pair of segments of the third region in the array, and the first region is positioned between the pair of segments of the second region in the array.

20. An apparatus that is adapted and configured to perform a method in accordance with claim 14.

* * * * *